United States Patent [19]
Widdershoven et al.

[11] Patent Number: 5,688,714
[45] Date of Patent: Nov. 18, 1997

[54] METHOD OF FABRICATING A SEMICONDUCTOR DEVICE HAVING A TOP LAYER AND BASE LAYER JOINED BY WAFER BONDING

[75] Inventors: Franciscus P. Widdershoven; Jan Haisma; Arie J. R. De Kock; Aart A. Van Gorkum, all of Eindhoven, Netherlands

[73] Assignee: U.S. Philips Corporation, New York, N.Y.

[21] Appl. No.: 612,201

[22] Filed: Mar. 7, 1996

Related U.S. Application Data

[63] Continuation of Ser. No. 679,978, Apr. 3, 1991, abandoned.

[30] Foreign Application Priority Data

Apr. 24, 1990 [NL] Netherlands ............................ 9000972

[51] Int. Cl.$^6$ ...................................................... H01L 21/38
[52] U.S. Cl. ........................ 437/160; 437/141; 437/974; 148/DIG. 12
[58] Field of Search .................... 437/160–162, 437/63, 76, 974, 141; 148/DIG. 12, DIG. 135, DIG. 150, DIG. 18, DIG. 23, DIG. 34

[56] References Cited

U.S. PATENT DOCUMENTS

| 3,638,301 | 2/1972 | Matsuura | 437/160 |
|---|---|---|---|
| 3,879,230 | 4/1975 | Nakamura et al. | 437/150 |
| 4,638,552 | 1/1987 | Shimbo et al. | 437/946 |
| 4,700,466 | 10/1987 | Nakagawa et al. | 148/33.5 |
| 4,703,553 | 11/1987 | Mardesich | 437/160 |
| 4,738,935 | 4/1988 | Shimbo et al. | 148/DIG. 12 |
| 4,837,177 | 6/1989 | Lesk et al. | 148/33.5 |
| 4,837,186 | 6/1989 | Ohata et al. | 148/DIG. 12 |
| 4,931,408 | 6/1990 | Hshieh | 148/DIG. 126 |
| 4,935,386 | 6/1990 | Nakagawa et al. | 437/160 |

OTHER PUBLICATIONS

Silicon Processing for the VLSI Era; vol. 1; Wolf et al pp. 12, 21–25; 1986.

Primary Examiner—Michael Trinh

[57] ABSTRACT

A method is set forth of manufacturing a silicon body (5) having an n-type top layer (1') and an adjoining, more highly doped n-type base layer (2'), by which a first, n-type silicon slice (1) and a second, more highly doped n-type silicon slice (2) are put one on the other and then bonded together by heating. To obtain a low contact resistance between top layer (1') and base layer (2'), a boundary layer having a higher doping than the to player (1') is provided in the top layer (1') adjoining the base layer (2'). According to the invention, the boundary layer is formed by diffusion of an n-type dopant (11, 14) into the first slice (1) from the second slice (2) during heating. The concentration of the n-type dopant (11, 14) is taken to be so high in this case that boron (12) present as an impurity is overdoped, so that undesired pn transitions cannot occur. Measures according to the invention present the advantage that pollution of the first slice (1) is counteracted, while in addition the boundary layer is given a steep concentration profile. Semiconductor devices manufactured in body (5) will as a result have a comparatively high switching speed and a comparatively low forward bias.

11 Claims, 3 Drawing Sheets

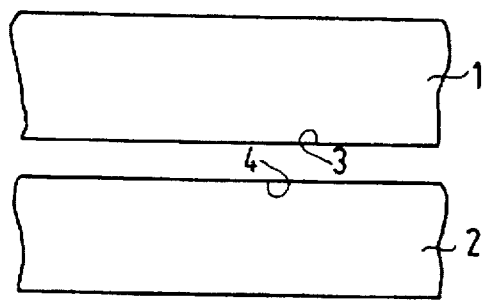
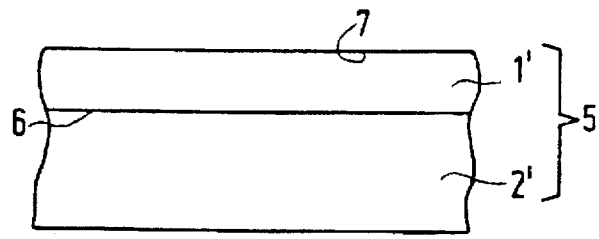
FIG.1A   FIG.1B
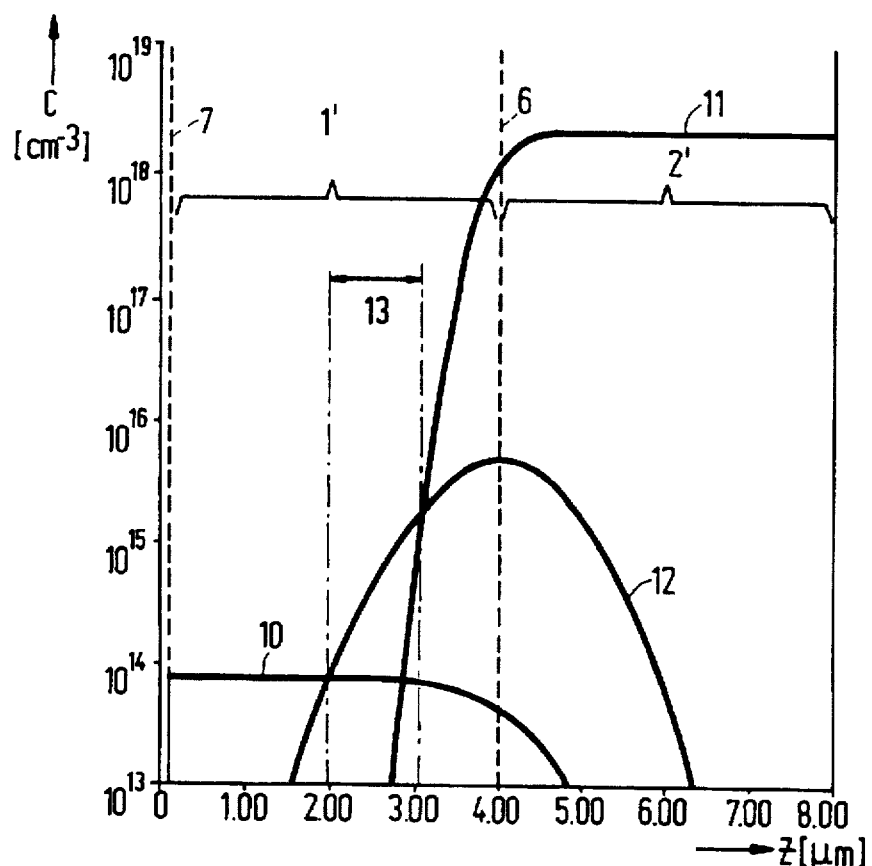
FIG.2A

METHOD OF FABRICATING A SEMICONDUCTOR DEVICE HAVING A TOP LAYER AND BASE LAYER JOINED BY WAFER BONDING

This is a continuation of application Ser. No. 07/679,978, filed Apr. 3, 1991, abandoned.

The invention relates to a method of manufacturing a silicon body having an n-type top layer and an adjoining, more highly doped n-type base layer where a first n-type silicon slice and a second, more highly doped n-type silicon slice are placed one on the other and then bonded together by heating, a boundary layer with a higher doping than the top layer being thus provided in the top layer adjoining the base layer. A low contact resistance between top layer and base layer is realised by the provision of this boundary layer. The body can then be ground or etched off in order to obtain a top layer of a desired thickness.

A silicon body obtained by such a method is particularly suitable as a starting material for manufacturing semiconductor devices, a body having an epitaxial layer thicker than approximately 100 microns normally being used as the starting material, such as, for example, for high-voltage semiconductor devices. High-voltage diodes or transistors may be provided in the top layer by means of usual techniques. These diodes and transistors can be safely operated up to a certain voltage, which voltage increases with the thickness and decreases with the doping concentration of the top layer. In practice, therefore, the thickness is often greater than 100 microns, while the doping is lower than $10^{15}$ cm$^{-3}$. The base layer is used for connecting a cathode or collector. Charge carriers may be injected into the top layer from the base layer. The base layer, therefore, must have the highest possible doping. In addition, the base layer forms a series resistance for the diode or transistor. Since the base layer has a thickness which is the same as that of a silicon slice, the series resistance is comparatively great. To keep the generation of heat in the base layer low, therefore, the base layer is also doped as highly as possible in practice with more than $10^{18}$ atoms per cm$^3$.

BACKGROUND OF THE INVENTION

A method of the kind described in the opening paragraph is known from the European Patent Application No. 0 190 935, in which the boundary layer having a higher doping is realised in that a more highly doped layer is provided by implantation or diffusion in the first slice before bonding of the two slices.

The known method described has the disadvantage that the first slice, which is weakly doped, may become polluted during the application of the more highly doped layer. The more highly doped layer is made, for example, through ion implantation, a heat treatment in oxidizing atmosphere, and etching of an oxide layer created during the heat treatment. In addition, this layer is subjected to a heat treatment both during implantation or diffusion of the dopant and during bonding of the two slices. This means that the dopant will diffuse away from the layer, so that a less steep concentration profile of this dopant is realised. The steepness of a concentration profile influences the characteristics of semiconductor elements. Thus high-voltage diodes, for example, exhibit a forward bias which is dependent on the steepness of the concentration profile between top layer and base layer. This bias, which will be across the diode when a current flows through it, becomes lower in proportion as the steepness of the concentration profile becomes greater. The switching on/off of semiconductor elements is also influenced by the steepness of the concentration profile. The steeper the concentration profile, the more quickly this switching on/off can take place.

SUMMARY OF THE INVENTION

The invention has for its object inter alia to counteract the above disadvantages.

According to the invention, the method is for this purpose characterized in that the boundary layer is formed by diffusion of an n-type dopant into the first slice from the second slice during heating, the concentration of this dopant being higher than that of boron which is present as an impurity.

The invention is based on the recognition that surfaces of silicon slices are practically always polluted with boron. During bonding of two slices according to the known method, therefore, a boundary region is formed between top layer and base layer in which boron will be present. If, for example, a first weakly doped ($<10^{15}$ cm$^{-3}$) n-type silicon slice is bonded to a second, more highly doped n-type silicon slice, boron present at the interface will diffuse into the first slice when heated during bonding. Since the first slice is weakly doped, a boundary region can arise in the first slice with a boron concentration which is higher than the sum of the concentrations of n-type dopants in this region. Since boron is an acceptor, this will lead to a p-type region between n-type regions. The presence of this region will cause the forward bias of a diode manufactured with such a silicon body to be higher than without this region. In other words, it seems as if a region of high resistance is present at the interface between top layer and base layer.

The problem described above is solved by the measure according to the invention in that the boron in the first slice is overdoped by an n-type dopant. This dopant is diffused from the second slice into the first slice. The weakly doped first slice then need not be provided with a more highly doped layer before bonding, so that pollution of the first slice is prevented. In addition, the steepness of the concentration profile between the top layer and the base layer will increase, since the two slices are heated during bonding only.

Possible dopants for the second slice are arsenic, antimony, and phosphorus. Arsenic and antimony have diffusion constants which are lower than those of boron. This means that comparatively long diffusion times are necessary. This is because the boron present at the interface will diffuse more quickly into the first slice than does the arsenic or antimony from the second slice, so that a region is created in which boron can overdope the low doping from the first slice. If diffusion continues long enough, the boron concentration will become weaker all the time because of the limited quantity of boron at the interface, while diffusion of arsenic or antimony from the second slice will make the n-type doping in the first slice continuously higher. Eventually, a situation will arise in which the concentration of the boron is lower everywhere than that of the n-type dopants. Preferably, a second slice is used in which the boundary layer is formed by diffusion of phosphorus from the second slice into the first slice. Phosphorus has a diffusion constant which is comparable to that of boron. If the phosphorus concentration is so chosen that it is greater than the maximum boron concentration occurring, the phosphorus concentration will always be greater than the boron concentration also in the case of diffusion into the first slice during, for example, a temperature treatment. Heating during bonding, therefore, is already sufficient to realise a desired boundary layer.

Preferably, a second slice is used in which phosphorus is present throughout the entire thickness. No implantation or diffusion process is necessary then to provide the phosphorus, so that the method becomes cheaper. Moreover, the quantity of phosphorus available for diffusion into the first slice is practically unlimited. This means that a lower phosphorus concentration in the second slice can suffice. This is in contrast to diffusion from a layer in which, because of the limited quantity of phosphorus present in the layer, the concentration in the layer must be higher before bonding.

An additional advantage is obtained if according to the invention the quantity of phosphorus per unit volume in the second slice is greater than or equal to $10^{17}$ cm$^{-3}$. This doping is sufficiently high for giving a phosphorus concentration at the boundary surface in all practical cases higher than the concentration of boron impurities. A boundary surface quantity of boron of $10^{12}$ cm$^{-2}$, for example, leads to a maximum boron concentration of approximately $10^{16}$ cm$^{-3}$ after three hours of heating at approximately 1100° C., so that a phosphorus concentration of $10^{17}$ cm$^{-3}$ is capable of preventing the creation of a p-type region.

In practice, the second slice is doped as strongly as possible (>$10^{18}$ cm$^{-3}$) in order to be able to inject as many charge carriers as possible into the top layer and in order to obtain the lowest possible series resistance of the base layer. Phosphorus has such a high vapour pressure at temperatures at which monocrystalline silicon rods are made that too much phosphorus evaporates for doping concentrations in excess of $10^{19}$ cm$^{-3}$ to be realised. In practice, therefore, the possibility of a high phosphor doping is limited to approximately $10^{19}$ cm$^{-3}$ in the case of slices manufactured in a "floating zone" process. These slices, however, are mechanically weaker than slices grown from a melt by the "Czochralski" process. If a mechanically stronger slice having a doping concentration higher than $10^{18}$ cm$^{-3}$ is desired by way of second slice, it will be necessary to use a slice grown by the "Czochralski" process with an arsenic or antimony doping. It is advantageous then to use a second slice in which besides phosphorus also antimony or arsenic is present as a dopant. In practice, it is possible to use a second slice doped with arsenic or antimony in which, for example, a phosphorus layer is diffused or implanted into the surface to be bonded.

Silicon slices having an n-type doping higher than approximately $10^{18}$ cm$^{-3}$ may be manufactured from silicon rods drawn from a melt with antimony or arsenic doping. If phosphorus is added to this melt, a silicon rod having both a high antimony or arsenic doping and a phosphorus doping can be obtained in a simple manner. Addition of a quantity of phosphorus to the melt is a technologically very simple and inexpensive step, so that silicon slices manufactured by this technique can be cheaper than silicon slices having an arsenic or antimony doping in which a phosphorus layer is provided by diffusion or implantation. According to the invention, therefore, a second silicon slice is preferably used which is obtained from a silicon rod drawn from a melt comprising both antimony or arsenic and phosphorus.

DESCRIPTION OF THE DRAWINGS

The invention will be explained in more detail below, by way of example, with reference to drawings. In the drawings:

FIGS. 1A and 1B show the method of manufacturing a silicon body having an n-type top layer and an adjoining, more highly doped n-type base layer.

FIGS. 2A, 2B and 2C show doping concentrations as a function of the depth at right angles to the surface of a semiconductor body which was made by bonding of two slices.

The Figures are purely diagrammatic and not drawn to scale. Corresponding parts are generally designated with the same reference numerals in the Figures.

DESCRIPTION OF THE INVENTION

Figure 2B:
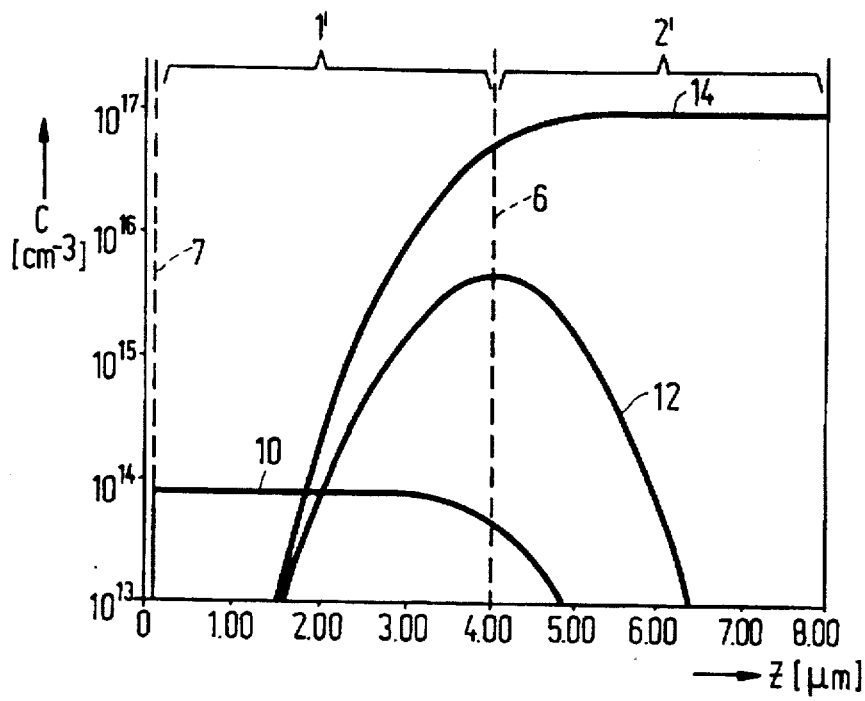

FIG. 1 shows the method of manufacturing a silicon body having an n-type top layer and an adjoining, more highly doped n-type base layer. FIG. 1A shows two silicon slices 1 and 2. The first slice 1 consists of weakly doped n-type material, for example, with a phosphorus doping of $8 \times 10^{13}$ cm$^{-3}$. The second slice 2 consists of a highly doped material having a doping of the same conductivity type, for example, with an antimony doping of $2.1 \times 10^{18}$ cm$^{-3}$. The thickness of slices 1 and 2 is approximately 400 microns. Surfaces 3 and 4 of the slices 1 and 2 are bonded together. To this end, the surfaces 3 and 4 are first polished in order to obtain optically smooth surfaces and then activated in a chemical-mechanical fine-polishing treatment in which, for example, colloidal silicon dioxide in an alkaline solution with an oxidant is used, where the polishing liquid is known under the name Syton from Monsanto. The two slices 1 and 2 are then brought into mutual contact with their surfaces 3 and 4 in a dust-free atmosphere. The bonded slices are subsequently subjected to a heating treatment in order to increase the adhesion between slices 1 and 2, for example, three hours at 1120° C. This results in a semiconductor body 5 as sketched in FIG. 1B after etching or polishing of slice 1 down to a desired thickness. An interface 6 formed by the surfaces 3 and 4 represents the transition between the weakly doped top layer 1' created from slice 1 and the highly doped base layer 2' created from slice 2.

The characteristics of semiconductor bodies manufactured by means of semiconductor body 5, however, are found to be less than optimal. It is suspected that this is connected with a high-ohmic resistance layer adjoining the interface 6. The interface 6 was accordingly investigated more closely. The weakly doped top layer 1' was made 4 microns thick for this purpose and investigated by means of SIMS (Secondary Ion Mass Spectrometry). 10.5 keV primary $O_2^+$ions were used for this. The SIMS results were used in conjunction with results of a simulation program for describing the doping concentrations. The result can be seen in FIG. 2A. The depth Z in micrometers below the surface 7 of body 5 (FIG. 1B) is plotted on the horizontal axis. The weakly doped top layer 1' is between Z=0 and Z =4, the highly doped base layer 2' at Z ) 4. Surface 7 is at Z=0 and interface 6 at Z=4. The doping concentration C is plotted on the vertical axis in cm$^{-3}$. Lines 10, 11 and 12 represent the phosphorus, antimony, and boron concentrations, respectively. FIG. 2A shows concentration profiles for a semiconductor body 5 manufactured as described above for FIG. 1. It is clear that boron is present around the interface 6 (at Z=4). This boron impurity is found to be present on silicon slices practically always. The line 12 shows that the boron has diffused into the top layer 1' and the base layer 2' during heating. The total boron dose amounts to $7.3 \times 10^{11}$ cm$^{-2}$. It should be noted that part of the phosphorus has diffused (line 10) from the top layer 1' into the base layer 2', while part of the antimony has diffused (line 11) from the base layer 2' into the top layer 1'. The diffusion constant of antimony is approximately ten times lower than that of boron, so that consequently the boron originally present at the interface 6 diffuses more quickly into the top layer 1' than does the antimony of the base layer 2'. The result is a region 13 situated between Z=2 and Z=3 where the boron concentration is higher than the sum of the phosphorus and antimony concentrations. Since boron is an acceptor, this will lead to a p-type region between the n-type top layer 1' and the n-type base layer 2'. The boron pollution, consequently, causes additional pn transitions, which has an unfavourable influence on the characteristics of semiconductor devices made with semiconductor body 5.

Figure 2C:
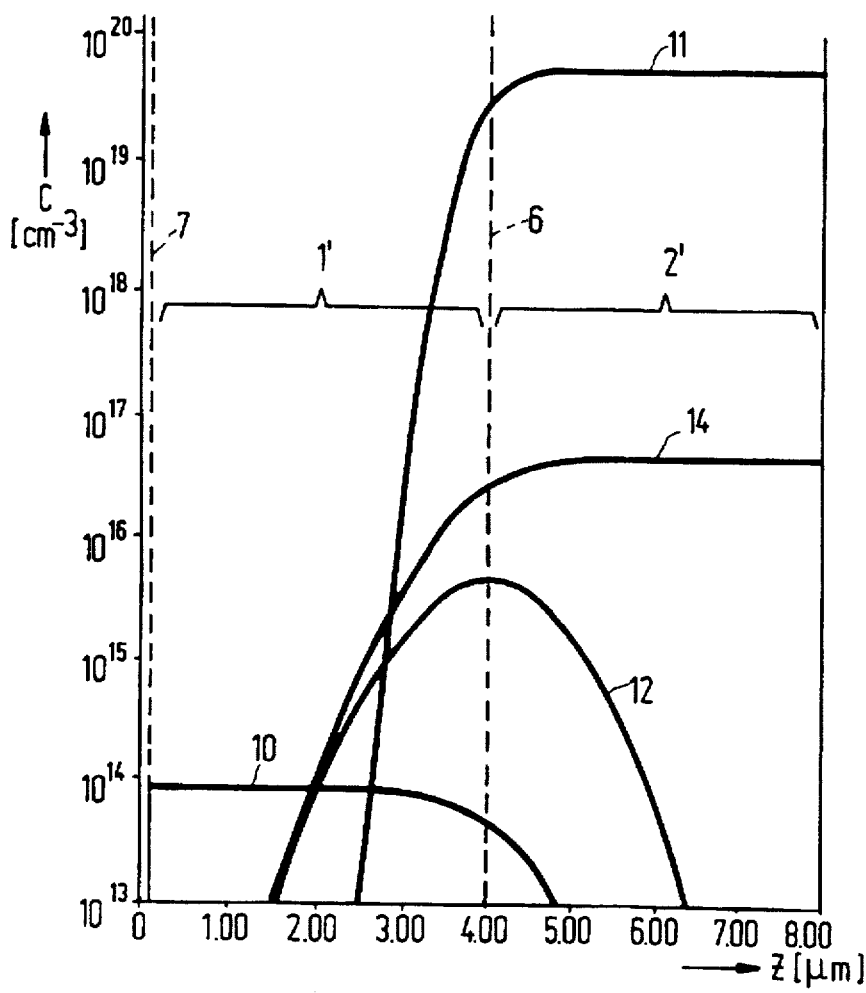

The invention now provides a method of manufacturing a semiconductor body 5 in which good semiconductor devices can be manufactured. To this end, a boundary layer having a higher doping than the top layer is provided in the top layer 1' adjoining the base layer 2', this boundary layer being formed by diffusion of an n-type dopant into the first slice 1 from the second slice 2 during heating, the concentration of this dopant being higher than that of the boron present as an impurity. The n-type dopant is preferably formed by phosphorus. The provision of phosphorus in slice 2 may take place in usual manner by means of ion implantation or diffusion. Preferably, however, a slice is used as slice 2 in which phosphorus is present throughout the entire thickness. FIG. 2B shows the doping concentrations in the case in which a slice 2 having a phosphorus doping of $1\times10^{17}$ cm$^{-3}$ is used instead of a slice having an antimony doping as in FIG. 2A. If the quantity of phosphorus per unit volume is greater than or equal to $10^{17}$ cm$^{-3}$, the sum of the phosphorus concentrations 10 and 14 in slice 1 will be greater than the boron concentration 12 after bonding in all practical cases. An additional advantage is obtained when a slice is used for the second slice in which besides phosphorus also antimony or arsenic is present as a dopant. The antimony or arsenic may then be so strongly doped that sufficient charge carriers are present in the base layer for injection into the top layer and that the base layer forms a low series resistance, while the phosphorus ensures that the boron present as an impurity is overdoped, so that no high contact resistance is formed between top layer and base layer. Preferably, such a slice 2 is obtained from a silicon rod drawn from a melt which contains both antimony or arsenic and phosphorus. A slice is then used for slice 2 having, for example, an arsenic doping of $5\times10^{19}$ cm$^{-3}$ and a phosphorus doping of $5\times10^{16}$ cm$^{-3}$. FIG. 2C shows the doping concentrations in body 5 after bonding. The line 14 indicates the phosphorus concentration derived from the second slice 2 and line 11 indicates the arsenic doping. It is evident that the boron concentration 12 is nowhere higher than the sum of the arsenic and phosphorus concentrations 11, 10 and 14, so that a p-type region is nowhere created. A semiconductor body 5 made by a method according to the invention, where the boron present as an impurity is overdoped by an n-type dopant, can serve as the basis for the manufacture of good semiconductor devices.

Figure 3:
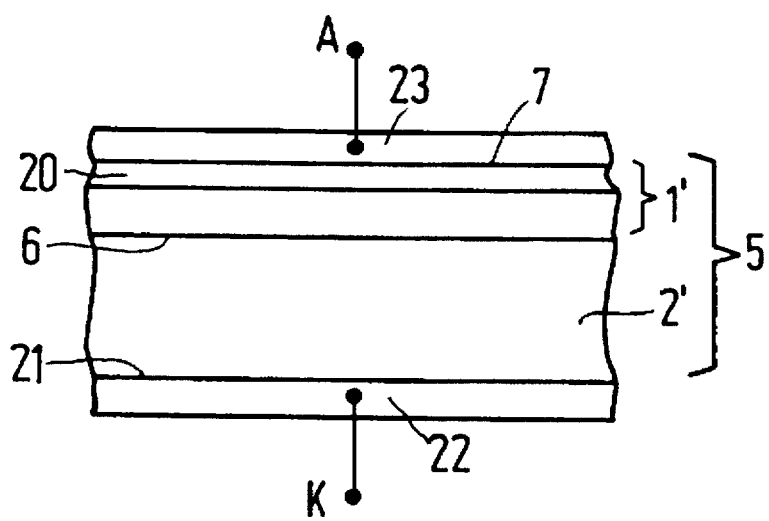
FIG. 3 shows a cross-section through a high-voltage diode manufactured by a method according to the invention.

FIG. 3 shows an application of the semiconductor body 5 obtained by the method according to the invention. In a semiconductor body 5, an acceptor layer 20 of boron having a doping of $1\times10^{19}$ cm$^{-3}$ is provided by way of example in surface 7 by usual techniques, after which metallizations 22 and 23 of, for example, aluminium are provided on surfaces 7 and 21. The structure thus created acts as a high-voltage diode, layer 22 being the cathode and layer 23 the anode.

Figure 4:
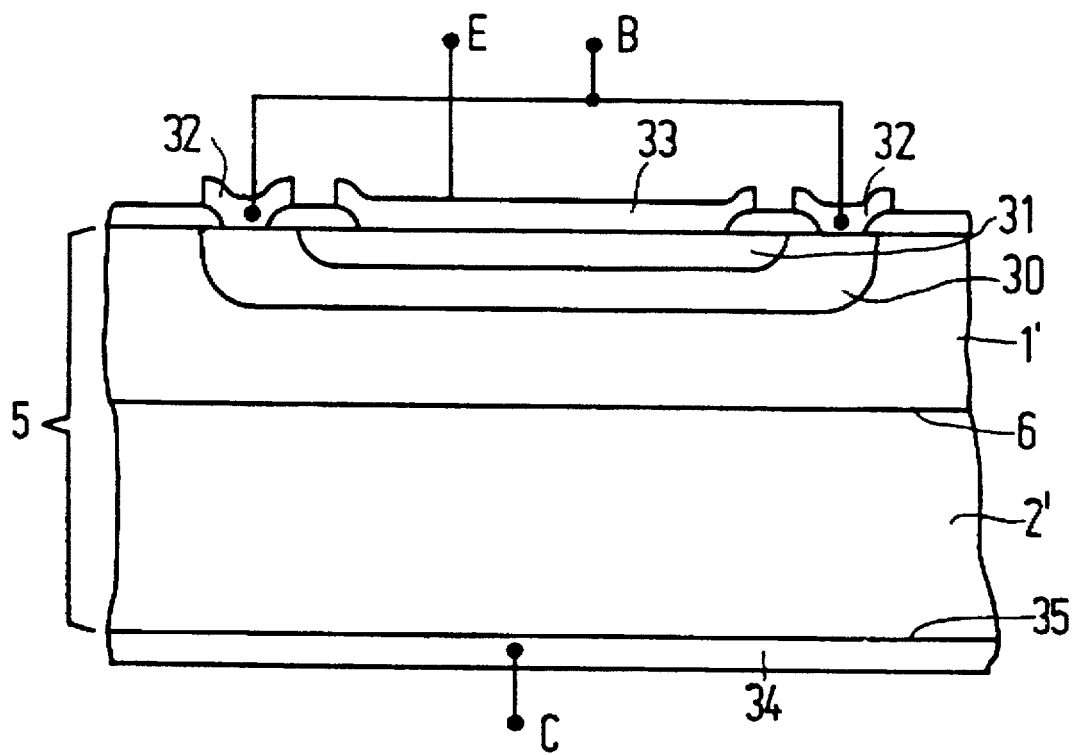
FIG. 4 shows a cross-section through a power transistor manufactured by a method according to the invention.

FIG. 4 shows a power transistor obtained by the method according to the invention. The starting point is again the semiconductor body 5. By means of standard techniques, p-type doped region 30 with $2\times10^{17}$ cm$^{-3}$ boron doping and n-type doped region 31 with, for example, $1\times10^{20}$ cm$^{-3}$ arsenic are created in the weakly doped top layer 1'. An npn structure is thus created which may function as a transistor. The p-type region 30 is connected to the base connection B by means of metallization layers 32 made of, for example, aluminium, while the n-type region 31 is connected to the emitter E of the transistor via metallization layer 33. Surface 35 of base layer 2' is metallized with layer 34 of aluminium and is connected to the collector connection C.

We claim:

1. A method of manufacturing a silicon body having a weakly doped n-type top layer and an adjoining highly doped n-type base layer, comprising the steps of:

providing a doped first n-type silicon slice with a doping concentration of less than about $10^{15}$ cm$^{-3}$, said first silicon slice having a polished surface;

providing a doped second n-type silicon slice with a doping concentration greater than the doping concentration of the first silicon slice, the second silicon slice having a phosphorous doping as a first doping impurity and either an antimony or arsenic doping as a second doping impurity at a doping concentration greater than the phosphorous doping concentration, said second silicon slice also having a polished surface;

bringing the polished surfaces of the first and second silicon slices into contact with each other and heating said first and second silicon slices while the polished surfaces are in contact with each other at a temperature and for a time sufficient to bond said polished surfaces, said temperature and time being sufficiently high also to diffuse the phosphorous first doping impurity from the second silicon slice into the first silicon slice to form a boundary layer in the first silicon slice having a doping concentration higher than the doping concentration elsewhere in the first silicon slice, the boundary layer assuring a low contact resistance between the first and second silicon slices, the phosphorous first doping impurity having a doping concentration sufficiently high to overdope any boron diffusion into the boundary layer from boron contamination of the polished surfaces, the second doping impurity diffusing more slowly than phosphorous into the boundary layer to provide a steep doping concentration profile between the first and second silicon slices.

2. The method of claim 1 wherein the doping concentration of phosphorous in the second silicon slice is about $5\times10^{16}$ cm$^{-3}$.

3. The method of claim 1 wherein the doping concentration of phosphorous in the second silicon slice is equal to or greater than about $10^{17}$ cm$^{-3}$.

4. The method of claim 1 wherein the doping concentration of the second doping impurity in the second silicon slice is equal to or greater than about $10^{18}$ cm$^{-3}$.

5. The method of claim 1 wherein the doping concentration of the second doping impurity in the second silicon slice is on the order of $5\times10^{19}$ cm$^{-3}$.

6. The method of claim 1 wherein the first doping impurity is present throughout the provided second silicon slice.

7. The method of claim 1 wherein the second doping impurity is present throughout the provided second slice.

8. The method of claim 1 wherein the first silicon slice is doped with phosphorous.

9. The method of claim 1 wherein the second silicon slice is obtained from a silicon rod drawn from a melt.

10. The method of claim 1 wherein the first and second silicon slices are brought into contact with each other and heated to a temperature of about 1100 degrees Centigrade for about 3 hours.

11. A method of manufacturing a silicon body having an n-type top layer and an adjoining, more highly doped n-type base layer consisting in that a first n-type silicon slice and a second, more highly doped n-type silicon slice are placed one on the other and then bonded together by heating, a boundary layer with a higher doping than the top layer being thus provided in the top layer adjoining the base layer, characterized in that the boundary layer is formed by diffusion of an n-type dopant into the first slice from the second slice during heating, the concentration of the diffused dopant in the boundary layer being higher than the concentration of boron which is present in the boundary layer as an impurity and in that a second slice is used which is obtained from a silicon rod drawn from a melt, which contains phosphorous as a first dopant and contains either antimony or arsenic as a second dopant, where the concentration of antimony or arsenic is larger than the concentration of phosphorous.

* * * * *